United States Patent
Helm et al.

(10) Patent No.: US 9,548,730 B1
(45) Date of Patent: Jan. 17, 2017

(54) CIRCUIT FOR IMPROVED FET SWITCHING SPEED

(71) Applicant: Raytheon Company, Waltham, MA (US)

(72) Inventors: Brian P. Helm, Waltham, MA (US); Michael G. Hawkins, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/010,316

(22) Filed: Jan. 29, 2016

(51) Int. Cl.
*H03K 17/0412* (2006.01)
*H03K 17/687* (2006.01)
*H01L 27/06* (2006.01)

(52) U.S. Cl.
CPC ..... *H03K 17/04123* (2013.01); *H01L 27/0629* (2013.01); *H03K 17/6871* (2013.01); *H03K 2017/6875* (2013.01)

(58) Field of Classification Search
CPC ............... H03K 17/04123; H03K 17/6871; H03K 2017/6875; H01L 27/0629
See application file for complete search history.

(56) References Cited

U.S. PATENT DOCUMENTS

| | | | | |
|---|---|---|---|---|
| 3,872,325 A * | 3/1975 | Adams | ................ | H03K 17/687 327/389 |
| 5,083,095 A * | 1/1992 | Madaffari | ............... | H03F 3/345 330/277 |
| 5,180,998 A * | 1/1993 | Willems | ................ | H03H 11/20 327/237 |
| 5,345,123 A * | 9/1994 | Staudinger | ................ | H03F 1/56 327/306 |
| 5,767,721 A * | 6/1998 | Crampton | .......... | H03K 17/6871 327/308 |
| 6,496,072 B2 * | 12/2002 | Cho | ..................... | H03G 1/0088 330/284 |
| 6,853,235 B2 * | 2/2005 | Nakayama | ................ | H03F 1/56 327/379 |
| 6,873,200 B2 * | 3/2005 | Evers | ................... | H03K 17/162 327/362 |
| 6,903,596 B2 * | 6/2005 | Geller | ....................... | H01P 1/15 327/308 |
| 7,026,858 B2 * | 4/2006 | Tosaka | ................ | H03K 17/693 327/308 |

* cited by examiner

*Primary Examiner* — Kenneth B Wells
(74) *Attorney, Agent, or Firm* — Burns & Levinson LLP; Joseph M. Maraia

(57) ABSTRACT

In order to increase the switching speed of an RF FET in an RF shunt circuit, a second, smaller, FET, with respect to the size of the RF FET, is connected directly to the gate of the RF FET to shunt the gate to ground quickly when switched from the off-state to the on-state. The smaller FET switches faster, due to being smaller than the larger RF FET, but it is effectively open-circuited in terms of RF performance when off because it is so small.

20 Claims, 3 Drawing Sheets

CIRCUIT FOR IMPROVED FET SWITCHING SPEED

BACKGROUND OF THE INVENTION

RF phase and attenuator circuits are known where a Field Effect Transistor (FET) is used to process an RF signal. As shown in FIG. 1, generally, an RF shunt circuit 100 includes a FET T1 with a resistor R1 used to couple a control signal Vgate to the gate of the FET T1. In operation, flow of the RF signal from the drain to the source of the FET T1 is controlled by the signal Vgate.

As known, relatively large FETs are used for RF switching in broadband designs in order to provide matching and low insertion loss. These large transistors need about 3 KOhm of resistance on the gate. A FET has a capacitance C that is a function of its size and, as relatively large FETs are used, in order to provide the required RF functionality, the capacitance C is high. The on/off switching time of the FET is a function of the R*C time constant and known FETs switch relatively slowly which affects performance, specifically the time to turn off.

Prior approaches to increasing FET switching speed have included reducing R or C, i.e., the overall time constant, or to change the applied voltages such that the switching time is faster. Reducing the series resistance, i.e., the "R" in the RC time constant, however, results in higher loss in the FET and that loss negatively impacts RF performance. In addition, reducing the series resistance R is not a viable option in phase/attenuator bits because, below a certain value, circuit losses due to the inability to isolate the transistor gate from the RF circuit affect performance.

Further, the size of the switching transistor in phase and attenuator circuits is a fixed value dependent on the specific phase or attenuation that one is trying to achieve. As a result, reducing the transistor size, in order to reduce C, does not work with phase/attenuator bits as the desired phase shift performance might not be achievable.

Another approach places forward and reverse diodes in parallel with the series gate resistor to allow a low-impedance path to the gate during turn-off. This approach requires a path to ground, provided by a large shunt resistor, to limit current flow in the diodes. The parallel diodes approach, however, does not sufficiently isolate the gate for optimal RF signal performance.

What is needed is an approach to speeding up the switching speed of RF FETs without degrading performance.

BRIEF SUMMARY OF THE INVENTION

Embodiments of the present invention add a smaller FET, with respect to the size of the RF FET, directly to the gate of the RF FET to couple the gate to ground quickly when switched from off-state to on-state. Essentially, the effective RC time constant of the RF FET is changed, i.e., reduced. The smaller FET switches faster (due to the smaller size) than the larger FET, but it is effectively open-circuited in terms of RF performance when off because it is so small. In addition, the size can be as small as the transistor manufacturing process allows. This increases the resistance to ground of the small FET, but is usually still an order of magnitude smaller resistance than the resistor on the gate of the large FET. Furthermore, the small shunt FET can be double- or triple-stacked in series to reduce RF impact further and provide additional switching speed improvement in the on-to-off transition.

In one embodiment, a circuit includes a first FET having a corresponding first size; a first resistive element having a first end coupled to a gate of the first FET; a second FET having a corresponding second size and a drain coupled to the gate of the first FET; and a second resistive element having a first end coupled to a gate of the second FET and a second end coupled to a second end of the first resistive element. A ratio of the first size to the second size is in a range R1, where R1>100:1 and each of the first and second FETs is a depletion-mode device.

In another embodiment, the circuit additionally includes a third FET having a corresponding third size and a drain coupled to a source of the second FET; and a third resistive element having a first end coupled to a gate of the third FET and a second end coupled to the second end of the second resistive element. The third FET is also a depletion-mode device and a ratio of the first size to the third size is in a range R2, where R2>100:1.

The first, second and third sizes are each functions of a total gate width value of the respective FET.

A circuit, in accordance with another embodiment includes a first field effect transistor (FET) having a corresponding first active channel size; a first resistive element having a first end coupled to a gate of the first FET; a second FET having a corresponding second active channel size and a drain coupled to the gate of the first FET; and a second resistive element having a first end coupled to a gate of the second FET and a second end coupled to a second end of the first resistive element. Each of the first and second FETs is a depletion-mode device and a ratio of the first active channel size to the second active channel size is in a range R1, R1>100:1.

Further, a third FET having a corresponding third active channel size and a drain coupled to a source of the second FET; and a third resistive element having a first end coupled to a gate of the third FET and a second end coupled to the second end of the second resistive element may also be provided. The third FET is a depletion-mode device and a ratio of the first active channel size to the third active channel size is in a range R2, where R2>100:1.

In another embodiment, an RF signal processing device includes a semiconductor substrate. The substrate includes a first depletion-mode field effect transistor (FET) having a first size; a first resistive element having a first end coupled to a gate of the first FET; a second depletion-mode FET having a second size and a drain coupled to the gate of the first FET; and a second resistive element having a first end coupled to a gate of the second FET and a second end coupled to a second end of the first resistive element. A ratio of the first size to the second size is in a range R1, where R1>100:1.

BRIEF DESCRIPTION OF THE DRAWINGS

Various aspects of at least one embodiment of the present invention are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The figures are provided for the purposes of illustration and explanation and are not intended as a definition of the limits of the invention. In the figures.

DETAILED DESCRIPTION

Figure 1:
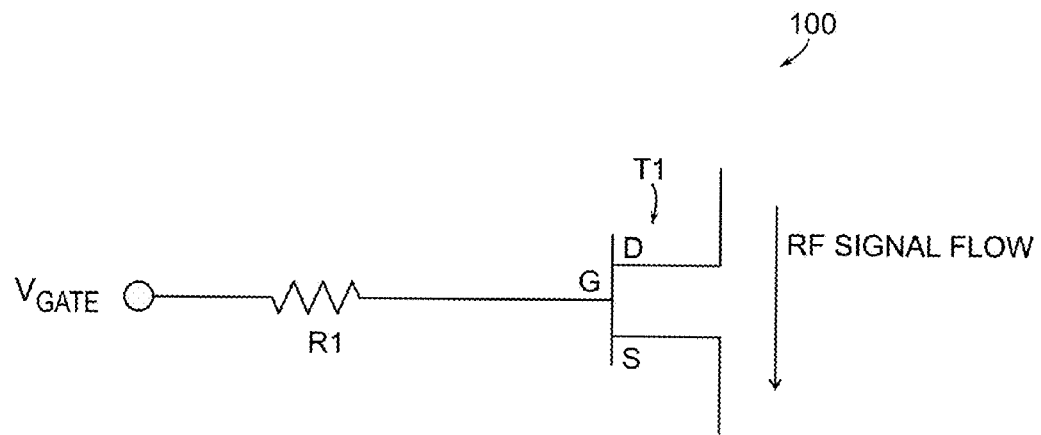
FIG. 1 is an RF shunt circuit as known in the prior art.

In the following detailed description, numerous specific details are set forth in order to provide a thorough understanding of the embodiments of the present invention. It will be understood by those of ordinary skill in the art that these embodiments of the present invention may be practiced without some of these specific details. In other instances, well-known methods, procedures, components and structures may not have been described in detail so as not to obscure the embodiments of the present invention.

Prior to explaining at least one embodiment of the present invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein are for the purpose of description only and should not be regarded as limiting.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Figure 2:
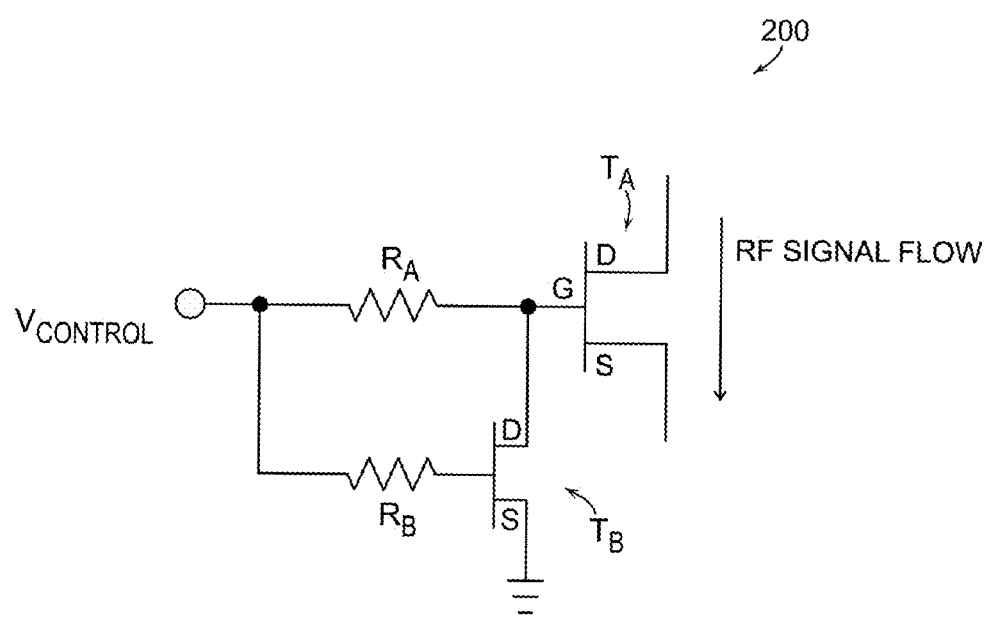
FIG. 2 is an RF shunt circuit in accordance with an embodiment of the present invention.

Referring now to FIG. 2, an RF shunt circuit 200 includes a first FET TA with a first gate resistor RA coupling a control signal Vcontrol to the gate of the first FET TA. In operation, flow of the RF signal from the drain to the source of the first FET TA is effectuated by the signal Vcontrol turning the first FET TA off and on as is known to those of ordinary skill in the art.

The first FET TA is a depletion-mode device implemented in any of the forms and structures as known to those of skill in the art, e.g., CMOS, GaAs, HEMT, etc. Generally, the RF signal being processed through the first FET TA has a frequency in the range of 0.5-100 GHz at about 100 mW. The first FET TA has a corresponding first total gate width value Tgw1 chosen to operate with the desired RF signal parameters.

The RF shunt circuit 200 also includes a second FET TB and a second gate resistor RB. A drain of the second FET TB is coupled to the gate of the first FET TA. The second gate resistor RB couples the gate of the second FET TB to also receive the control signal Vcontrol. The source of the second FET TB is coupled to the lowest voltage within the circuit, for example, ground. The second FET TB is also a depletion-mode transistor. It should be noted that the use of the term "coupled" references both a mechanical connection and an electrical or "operative" connection.

The second FET TB has a corresponding second total gate width value Tgw2 that is much smaller than the first total gate width value Tgw1 where a ratio R of Tgw1:Tgw2 is optimally, R>100:1. Further, as above, the first FET TA may be considered to have a capacitance CA while the second FET TB may be considered to have a capacitance CB where CA>>CB due to the relative sizes. As the second FET TB is so much smaller, and due to its smaller capacitance CB, it will turn on and off much faster.

As is known, in depletion-mode devices, a negative gate-to-source voltage causes a depletion region to expand in width and encroach on the channel from the sides, i.e., narrowing the channel. If the region expands to completely close the channel, the resistance of the channel from source to drain becomes large and the FET is effectively turned off like a switch. This is called pinch-off, and the voltage at which it occurs is called the pinch-off voltage. Conversely, a positive gate-to-source voltage increases the channel size and allows electrons to flow easily.

The control signal Vcontrol can be considered to be a pulse train oscillating between 0 and −5 volts, for example, with a pulse rate of about 100 MHz, i.e., a pulse every 10 nSecs. Accordingly, because the two FETs TA, TB are depletion-mode devices, the same signal levels will then turn them on and off. In operation, therefore, because the second FET TB is so much smaller, and its corresponding RB*CB switching time is smaller, it will turn on faster and, in turn, pull the gate of the first FET TA to ground much faster. In other words, it can be considered that the faster turning on of the second FET TB overcomes the relative slowness of the RA*CA switching time of the first FET TA.

In one embodiment of the present invention, the values of RA and RB are the same and in others the values may differ.

Figure 3:
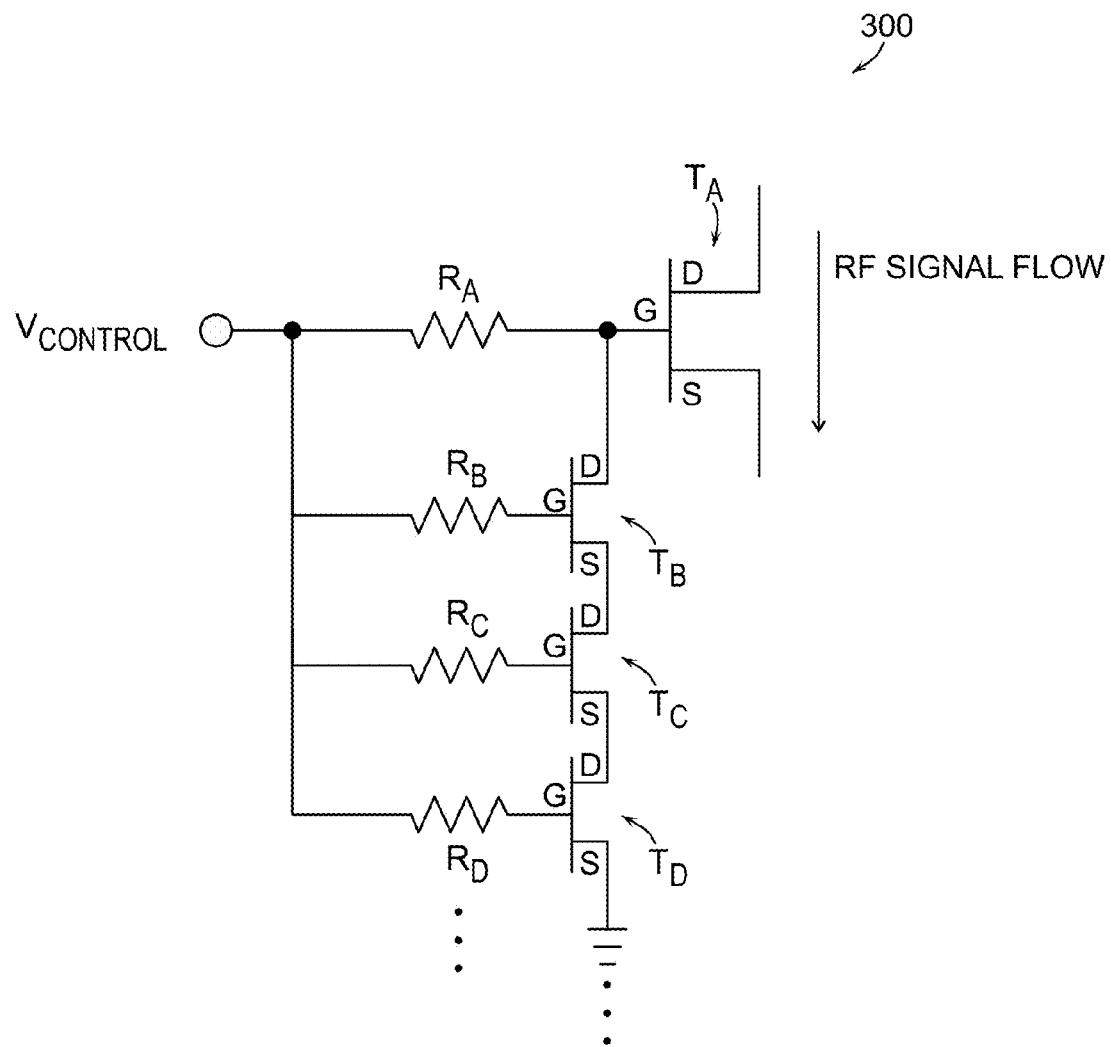
FIG. 3 is an RF shunt circuit in accordance with another embodiment of the present invention.

In another embodiment of the present invention, referring now to FIG. 3, an RF shunt circuit 300 includes the first FET TA, the first gate resistor RA, the second FET TB and the second gate resistor RB as described above with reference to FIG. 2. In addition, third and fourth transistors TC and TD are included where the drain of TC is coupled to the source of TB and the drain of TD is coupled to the source of TC, effectively coupling them in series. The FETs TC and TD have a respective gate resistor RC, RD coupling their gates to the control signal node.

Each of the third and fourth FETs TC, TD is a depletion-mode device and each has a respective second total gate width value Tgw3, Tgw4 that is much smaller than the first total gate width value Tgw1. The ratios Tgw1:Tgw3 and Tgw1:Tgw4 is each R>100:1. Further, as above, each of the third and fourth FETs may be considered to have a respective capacitance $C_C$, $C_D$ that is much smaller than CA due to the relative sizes.

As a result of the series-connected FETs TB, TC, TD, their respective capacitances combine to produce a total capacitance that is less than each of them, providing for a reduction in the RC time constant for the RF FET TA and, therefore, faster switching speed.

In one embodiment, the FETs are all manufactured on the same semiconductor substrate per processes known to those of ordinary skill in the art. These processes include GaAs pHEMT, GaAs mHEMT, GaN HEMT and GaAs MESFET. The smaller FETs would be placed as close as possible to the larger RF FET for optimal operation.

Figure 4:
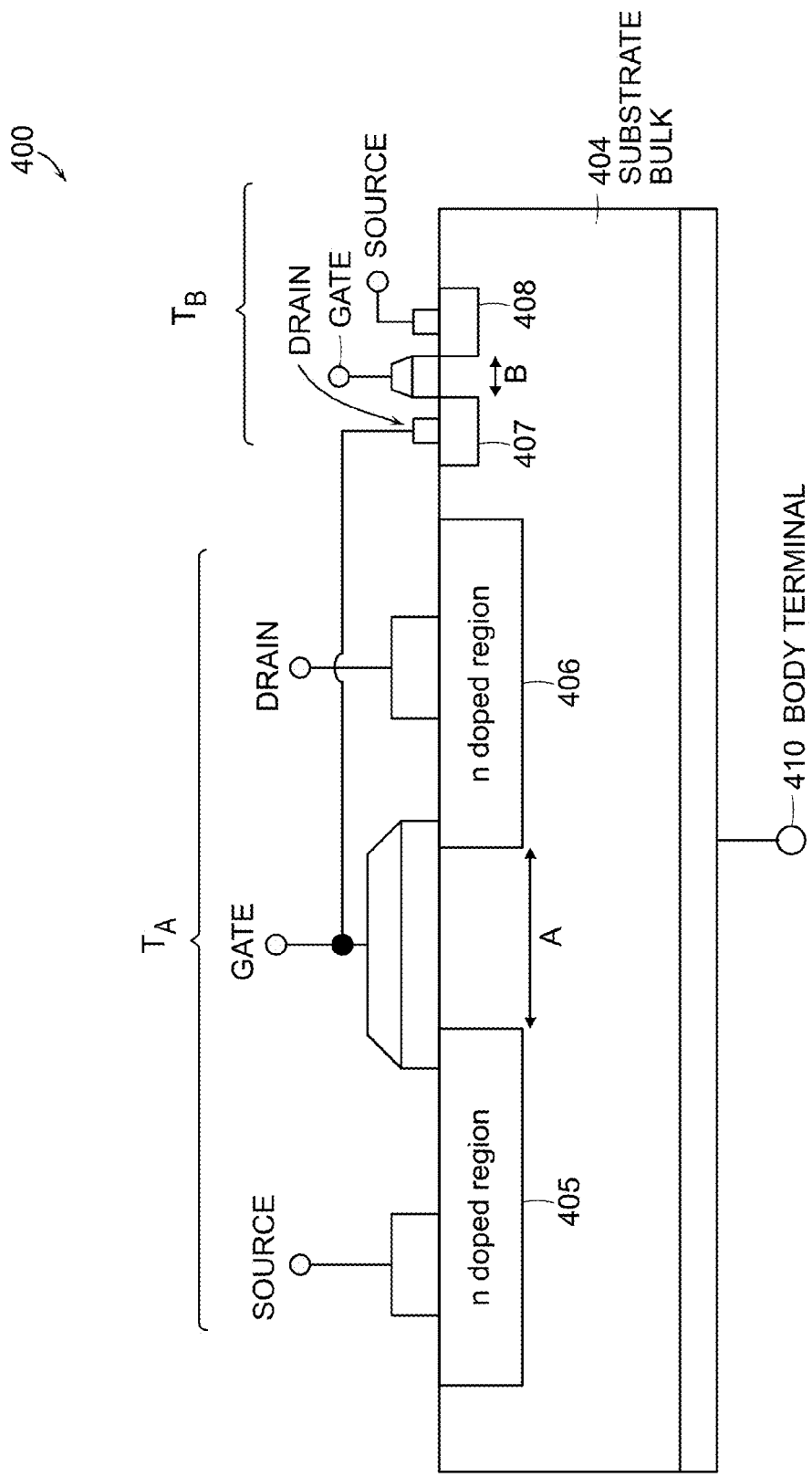
FIG. 4 is an embodiment of the present invention implemented in a semiconductor substrate.

Referring now to FIG. 4, an RF signal processing device 400 implemented on a semiconductor substrate 404 is presented. As shown in cross-section, the RF FET TA includes the gate, source and drain implemented in the bulk of the substrate. The distance A shown in the figure represents the active channel between the respective doped regions 405, 406 of the source and drain and, therefore, the size of the FET TA, as discussed above. The smaller FET TB includes the drain, source and gates also provided in the substrate per known techniques. The active channel length B is presented as smaller than the active channel A, per the discussion above, similarly disposed between the doped regions 407, 408. Here, merely for purposes of description and simple clarity, the drain of the second FET TB is shown as being connected to the gate of the RF FET TA outside of the semiconductor substrate. One of ordinary skill in the art will understand that the coupling could be accomplished by incorporation of necessary layers in the manufacture of the device.

Further, the substrate 404 includes a body terminal 410 as known in the art.

It should be noted that the gate resistors RA, RB (not shown for clarity) can be implemented in the device 400 per known techniques. Alternatively, these gate resistors could be provided externally to the device 400.

In addition, one of ordinary skill in the art will understand how the additional small FETs, per the discussion above, would be integrated into the device 400.

Advantageously, by placing the multiple smaller FETs in series, per the embodiment of FIG. 3, a total C value that is smaller than that which can be obtained for a single FET, due to limitations of the manufacturing process, can be obtained.

Further, while only three small FETs are shown in the embodiment of FIG. 3, it should be noted that this is merely for explanatory purposes and the invention is not limited to this number.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

Although the present disclosure has been described herein with reference to particular means, materials and embodiments, the present disclosure is not intended to be limited to the particulars disclosed herein; rather, the present disclosure extends to all functionally equivalent structures, methods and uses, such as are within the scope of the appended claims.

The invention claimed is:

1. A circuit, comprising:
a first FET having a corresponding first size;
a first resistive element having a first end coupled to a gate of the first FET;
a second FET having a corresponding second size and a drain coupled to the gate of the first FET; and
a second resistive element having a first end coupled to a gate of the second FET and a second end coupled to a second end of the first resistive element,
wherein a ratio of the first size to the second size is in a range R1, where R1>100:1, and
wherein each of the first and second FETs is a depletion-mode device.

2. The circuit of claim 1, wherein the first and second sizes are functions of a respective total gate width value.

3. The circuit of claim 1, further comprising:
a third FET having a corresponding third size and a drain coupled to a source of the second FET; and
a third resistive element having a first end coupled to a gate of the third FET and a second end coupled to the second end of the second resistive element,
wherein the third FET is a depletion-mode device, and
wherein a ratio of the first size to the third size is in a range R2, where R2>100:1.

4. The circuit of claim 3, wherein the third size is not equal to the second size.

5. The circuit of claim 3, wherein the first, second and third FETs and the first, second and third resistive elements are implemented in a same substrate.

6. The circuit of claim 5, wherein:
the substrate comprises a semiconductor having a body terminal; and
a source of the third FET is coupled to the body terminal.

7. The circuit of claim 1, wherein the first and second FETs are implemented in a same substrate.

8. The circuit of claim 7, wherein the first and second resistive elements are implemented in the same substrate as the first and second FETs.

9. A circuit, comprising:
a first field effect transistor (FET) having a corresponding first active channel size;
a first resistive element having a first end coupled to a gate of the first FET;
a second FET having a corresponding second active channel size and a drain coupled to the gate of the first FET; and
a second resistive element having a first end coupled to a gate of the second FET and a second end coupled to a second end of the first resistive element,
wherein each of the first and second FETs is a depletion-mode device, and
wherein a ratio of the first active channel size to the second active channel size is in a range R1, R1>100:1.

10. The circuit of claim 9, further comprising:
a third FET having a corresponding third active channel size and a drain coupled to a source of the second FET; and
a third resistive element having a first end coupled to a gate of the third FET and a second end coupled to the second end of the second resistive element,
wherein the third FET is a depletion-mode device, and
wherein a ratio of the first active channel size to the third active channel size is in a range R2, where R2>100:1.

11. The circuit of claim 10, wherein the third total gate width value is not equal to the second total gate width value.

12. The circuit of claim 10, wherein the first, second and third FETs and the first, second and third resistive elements are implemented in a same substrate.

13. The circuit of claim 12, wherein:
the substrate comprises a semiconductor having a body terminal; and
a source of the third FET is coupled to the body terminal.

14. The circuit of claim 9, wherein the first and second FETs are implemented in a same substrate.

15. The circuit of claim 14, wherein the first and second resistive elements are implemented in the same substrate as the first and second FETs.

16. The circuit of claim 14, wherein:
the substrate comprises a semiconductor having a body terminal; and
a source of the second FET is coupled to the body terminal.

17. An RF signal processing device, comprising:
a semiconductor substrate comprising:

a first depletion-mode field effect transistor (FET) having a first size;
a first resistive element having a first end coupled to a gate of the first FET;
a second depletion-mode FET having a second size and a drain coupled to the gate of the first FET; and
a second resistive element having a first end coupled to a gate of the second FET and a second end coupled to a second end of the first resistive element,
wherein a ratio of the first size to the second size is in a range R1, where R1>100:1.

18. The device of claim 17, wherein the first and second sizes are functions of a respective total gate width value.

19. The device of claim 17, wherein the semiconductor substrate further comprises:
a third depletion-mode FET having a corresponding third size and a drain coupled to a source of the second FET; and
a third resistive element having a first end coupled to a gate of the third FET and a second end coupled to the second end of the second resistive element,
wherein a ratio of the first size to the third size is in a range R2, where R2>100:1.

20. The device of claim 19, the size is a function of a respective total gate width value.

* * * * *